United States Patent [19]

Kreng et al.

[11] 3,976,944
[45] Aug. 24, 1976

[54] BIAS OPTIMIZED FET MIXER FOR VARACTOR TUNER

[75] Inventors: Jack K. Kreng, Portsmouth; Sanjar Ghaem-maghami, Chesapeake, both of Va.

[73] Assignee: General Electric Company, Portsmouth, Va.

[22] Filed: Feb. 13, 1975

[21] Appl. No.: 549,525

[52] U.S. Cl. .................................. 325/451; 325/319; 325/439; 325/457
[51] Int. Cl.² ........................................ H04B 1/28
[58] Field of Search ........... 325/430, 438, 439, 442, 325/445, 451, 452, 453, 457–460, 464–468, 488, 490, 318, 319, 397, 399, 401, 410, 411–413, 473, 479; 321/60, 61

[56] References Cited
UNITED STATES PATENTS

| | | | |
|---|---|---|---|
| 3,348,154 | 10/1967 | Fish, Jr. et al. | 325/439 |
| 3,493,869 | 2/1970 | Van Dijkum | 325/451 |
| 3,581,211 | 5/1971 | Maitland | 325/451 |
| 3,626,302 | 12/1971 | Nakamura | 325/451 |
| 3,694,756 | 9/1972 | Carlson | 325/451 |
| 3,863,136 | 1/1975 | Hanson | 325/451 |

*Primary Examiner*—Robert L. Griffin
*Assistant Examiner*—Jin F. Ng

[57] ABSTRACT

A field effect transistor may be used as the mixer in a VHF varactor tuner by the use of self-adjusting bias. Both maximum conversion gain can be realized when the oscillator injection voltage is low and low intermodulation and cross modulation products realized at higher oscillator injection voltages. Bias modification is achieved by use of the tuning voltage in a bias control circuit where FET drain current is adjusted while FET bias voltage is maintained substantially constant. Keeping the bias voltage for the FET substantially constant insures constancy of the FET input and output capacitance which in turn preserves the tuner's tuned circuits from being detuned and variably loaded.

6 Claims, 2 Drawing Figures

BIAS OPTIMIZED FET MIXER FOR VARACTOR TUNER

BACKGROUND OF THE INVENTION

The present invention relates to mixers for superheterodyne communication receivers such as television receivers. More particularly, the invention relates to the use of a field effect transistor as the mixing element in a varactor tuner for a television receiver.

Field effect transistors have desireable characteristics for use as the mixing element in a mixer. The high conversion gain of FETs, their near square law transfer characteristic and extended range of operation as compared with a bipolar transistor has won widespread use of FETs in mixers of mechanical tuners. One drawback of the FET as a mixer, however, is that when it is biased to achieve more linear operation to minimize cross modulation and intermodulation products, it requires an oscillator injection voltage in the range of 0.5 volt to 1.0 volt in order to achieve good conversion gain. In a varactor tuner, however, due to the large variation in Q between the low frequency channels and the high frequency channels, the oscillator injection voltage ranges from 0.1 volt to 0.6 volt. This large swing and the low oscillator injection voltage renders satisfactory operation with any single operating point impossible.

It is accordingly an object of the present invention to utilize a FET as the mixing element in a varactor tuner.

Another object of the present invention is to provide adjustable bias control for a FET mixer to establish optimum operating points for various ones of the channels in the band being tuned.

Bias adjustment can be achieved in many ways, but in a varactor tuner it was discovered that changing the bias voltage to the FET also changed the input and output capacitance of the FET, causing detuning and/or variable loading of the various tuned circuits in the RF amplifier, the local oscillator, and in the mixer circuit itself.

It is accordingly another object of the present invention to provide a bias controlled FET mixer in which the bias voltage is held substantially constant while drain current is varied.

These objects are generally achieved by the selection of a high conversion gain field effect transistor such as a dual gate MOSFET. A resistor network connected to the gate and source electrodes thereof establishes the DC voltage bias and the drain current for the FET for one channel, such as channel 2, at which channel the varactor tuned oscillator provides low oscillator injection voltage. The resistor network is proportioned to provide optimum conversion gain by the FET mixer for this channel. A transistor is connected to the source electrode of the FET and is responsive to the tuning voltage that is applied to the varactor diode tuned circuits to change the drain current of the FET as the tuning voltage changes. The tuning voltage is proportional to the oscillator injection voltage. The resistor network holds the bias voltage substantially constant while the drain current is varied to achieve the desired operating point for the FET for each of the channels in the band.

BRIEF DESCRIPTION OF THE DRAWINGS

These and other objects and features of the invention will be more readily understood from a detailed description of the invention taken in connection with the drawings in which.

DETAILED DESCRIPTION

Figure 1:
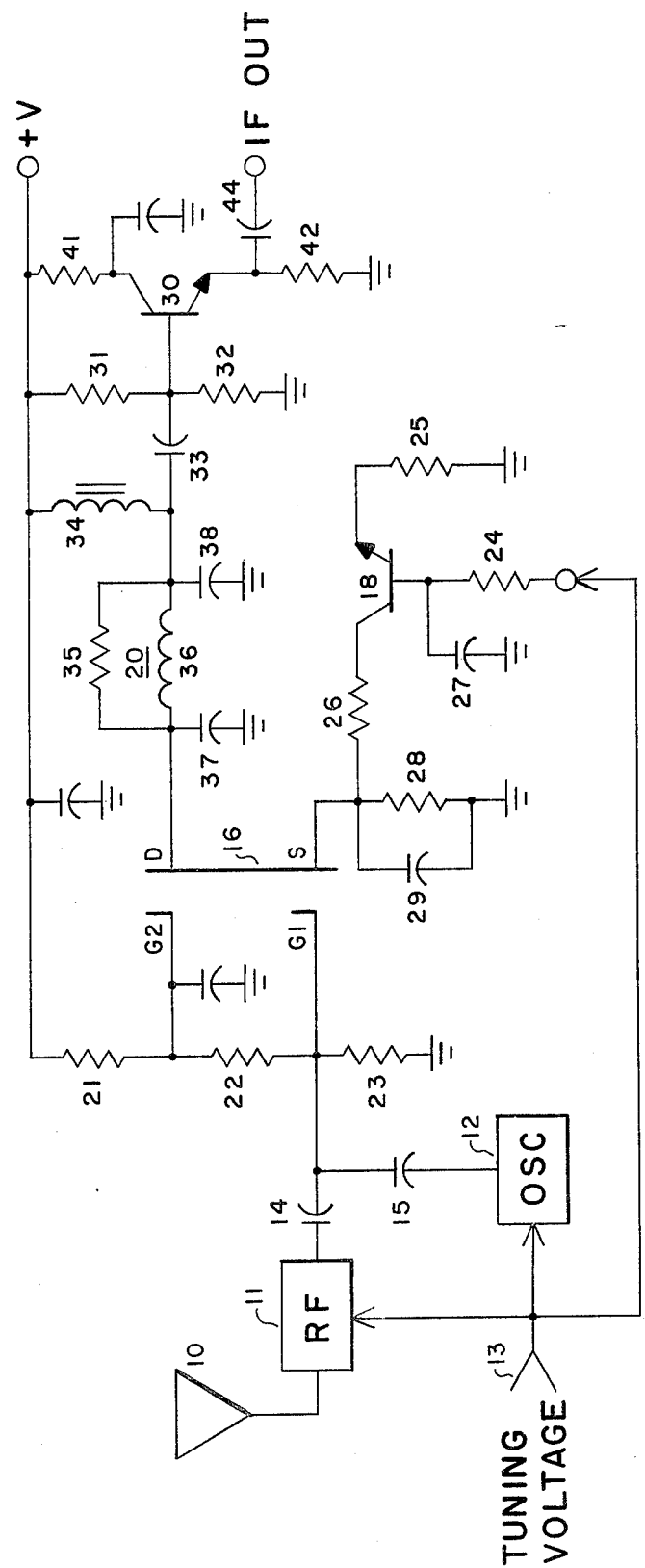
FIG. 1 is a partial block and partial schematic drawing of a portion of a varactor tuner including the mixer circuit of the present invention.

Referring now to FIG. 1 there is shown an RF amplifier 11 in block diagram form to which the RF signal received by antenna 10 is applied. The RF amplifier may be of the type which is broad band and serves merely to amplify the RF signals. However, it is preferable and shown that a tuning voltage 13 is applied to the RF amplifier. Such an RF amplifier will contain a tuned circuit including an element such as a varactor diode which is responsive to the tuning voltage to tune the RF amplifier to a particular one of the RF frequencies received.

An oscillator 12 is shown being responsive to the tuning voltage 13 and also preferably contains a varactor diode tuned circuit to generate a channel related signal. The channel related signal, commonly called the oscillator injection voltage, comprises a signal having a frequency in excess of the desired RF frequency by the IF frequency, nominally 45 megahertz. Since many forms of RF amplifiers and local oscillators including varactor tuned circuits are well known in the art and form no part of the present invention, specific details are not shown.

The RF signal and the channel related signal from the oscillator are both applied to gate G1 of the FET 16 by means of coupling capacitors 14 and 15 respectively. FET 16 comprises the mixing element of the mixer which incorporates the remainder of the elements shown in FIG. 1, as will be described. FET 16 is of the dual gate type, selected for its high conversion gain, and is shown having gates G1 and G2, a drain electrode D and a source electrode S. Resistors 21, 22 and 23 form a voltage divider network between the supply voltage +V and ground. The intermediate point between resistors 21 and 22 is connected to gate G2 and the intermediate point between resistors 22 and 23 is connected to gate G1. This voltage divider network along with source resistor 28 establishes the DC voltage bias point for operation of the FET, as will be described more fully below.

The drain electrode of the FET is connected to the DC supply +V by means of RF choke 34 and the parallel combination of inductor 36 and resistor 35. Both the inductors 34 and 36 present a low impedance to the DC voltage so that ample current is supplied to the FET 16. This current is limited only by the resistor 28 which completes the drain-source path to ground. Resistor 28 therefore establishes the DC drain current for the FET 16. Capacitor 29 is shown bypassing resistor 28 to avoid the establishment of AC voltages across this resistor.

The AC output from FET 16 is realized at the drain electrode to which filter 20 is connected. Filter 20 comprises the parallel combination of resistor 35 and inductor 36 bypassed to ground at each end with capacitors 37 and 38 respectively. This filter provides for passage of the IF frequency generated by the mixing action of FET 16 and sharply attenuates the higher RF frequencies also realized at the output of FET 16. The IF frequency is coupled to emitter-follower transistor 30 by means of coupling capacitor 33. Resistors 31 and 32 provide bias voltage to establish the operating point of the transistor 30. The collector electrode of transistor 30 is connected via resistor 41 to the supply +V, and resistor 42 in the emitter circuit connects the emitter to ground. The IF output is taken at the emiter by coupling and matching capacitor 44.

Prior to the present invention it was impractical to use a FET as the mixing element in a varactor tuner where the varactor tuner is used as the VHF tuning element in a television receiver. This is so because the injection voltage delivered by the local oscillator and the RF signal varies greatly in amplitude between the lowest and highest channels of each band of frequencies. This is caused by the difference in Q of the varactor tuned circuits between the low and high frequency channels. This variation in amplitude is too great to achieve satisfactory operation of a FET with any single operating point. While adjustable biasing of the FET was considered as a possible solution to this problem, it was found that when the DC voltage bias for the FET was shifted, the input and output capacitance of the device also shifted to cause the tuned circuits in the tuner to be detuned and/or variably loaded. It was discovered that this phenomenon of the change in FET capacitance would not occur if the drain current is changed while the DC voltage bias is held constant.

To accomplish such adjustable biasing, there is shown in FIG. 1 transistor 18 connected at its collector electrode by resistor 26 to the source electrode of the FET and by its base electrode via resistor 24 to receive the tuning voltage 13. Transistor 18 has its emitter electrode returned to ground by means of resistor 25. The base electrode is coupled to ground by capacitor 27 to insure that transistor 18 operates solely as a DC variable resistor under the control of the tuning voltage. The tuning voltage is selected to control the drain current of the FET since this voltage is directly proportional to the oscillator injection voltage level and to the amplitude of the RF signal at the mixer input. Accordingly, the transistor 18 has its initial point of conduction established by resistors 24 and 25 and its conduction increases with increased tuning voltage so that at channel 2, where conduction may be selected to begin, resistor 28 essentially determines the DC drain current for the FET 16. However, with increased conduction more and more current is drawn away from the source electrode through transistor 18 making the resistor 28 appear to be lower and lower in value.

Figure 2:
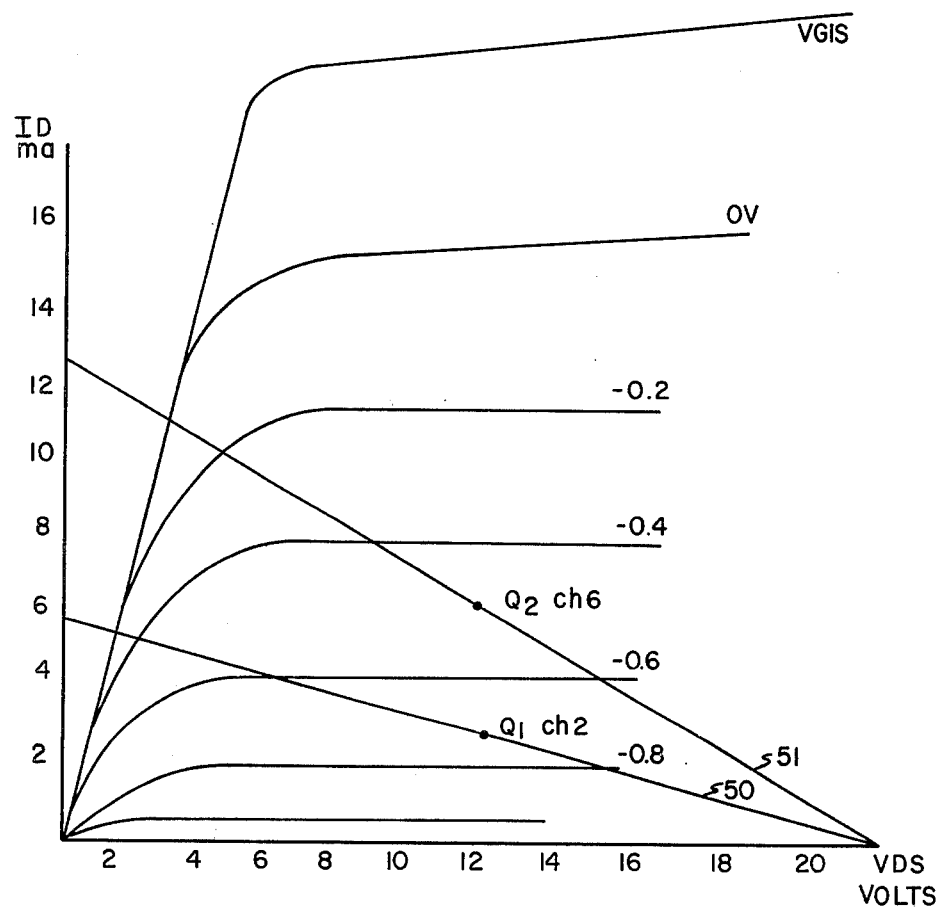
FIG. 2 is a plot of the characteristic curves of the FET shown in FIG. 1.

Reference may now be had to FIG. 2. FIG. 2 illustrates the operating characteristics of the FET 16, showing the DC input voltage curves $V_{G1S}$ in tenths of volts. The ordinate axis is calibrated in terms of DC drain current $I_D$ in milliamps, and the abscissa axis shows FET DC output voltage $V_{DS}$ in volts. Load line 50 represents the channel 2 operating condition with operating point $Q_1$ being shown. The operating point $Q_1$ is achieved when the source resistor 28 is at its full value of 3.6 kilohms. The input voltage $V_{G1S}$ is approximately −0.7 volt and the drain current $I_D$ is 3 milliamps. This is the condition when the tuning voltage is at its lowest level. The corresponding oscillator injection voltage applied to G1 by oscillator 12 is at its lowest amplitude. The transistor 18 is, therefore, either nonconducting or just beginning conduction depending upon the values of resistors 24 and 25, so that the operating point of the FET 16 is determined predominately by the value of resistor 28. Note that load line 50 is in the region of nonlinearity of the operating characteristics so that maximum FET conversion gain may be achieved.

Load line 51 represents the channel 6 operating condition. It is noted that for the operating point Q2 the output bias voltage $V_{DS}$ is maintained at 12 volts. The input voltage $V_{G1S}$ has changed slightly to −0.5 volt, whereas the drain current $I_D$ has approximately doubled to 6 milliamps. This is the condition when the tuning voltage is highest, channel 6 being the highest channel within the low range of the VHF band, and the transistor 18 is conducting fullest so that resistors 25 and 26 are coupled in parallel with the resistor 28, their values of 0.47 kilohms and 2.7 kilohms, respectively, reducing the overall load resistance to 1.7 kilohms. This condition is illustrated by the load line 51. Note that load line 51 is in a region of greater linearity than that of line 50. Cross modulation and intermodulation products are accordingly reduced.

FIG. 2 illustrates the static characteristics of the FET mixer 16, namely, the characteristics of the FET in the absence of oscillator injection voltage. Not showable in this figure is the effect of the dynamic bias, created by rectification in the FET of the oscillator injection voltage peaks, a phenomenon which is more pronounced with higher injection voltages.

This dynamic bias voltage is of such a polarity as to reduce the 0.2 volt $V_{G1S}$ change between Q1 and Q2 to approximately 0.05 volt. It can thus be said that the FET bias voltage is maintained substantially constant while the DC drain current is changed throughout the tuning range.

While a single embodiment of the invention has been described, it is intended that this embodiment be taken not in limitation but by way of exemplification and the scope of the invention be determined solely by the appended claims. For example, while fixed biasing for channel 2 and adjustment by transistor 18 to obtain the conditions necessary for channel 6 biasing are illustrated, it is possible to set the bias for channel 6 operation and adjust to obtain the proper conditions for channel 2 operation. Also, while a dual gate FET is shown, a single gate device with high conversion gain may also be used. Such variations and others that will occur to those skilled in the art are intended to be encompassed within the scope of the appended claims.

What is claimed and desired to be secured by letters patent of the United States is:

1. In a tuner of the type for receiving an RF signal and having oscillator means including a tuning element responsive to a tuning voltage to generate a channel related signal, wherein the amplitude of said channel related signal differs for the channels within the frequency band being tuned, a FET mixer comprising:

a FET having electrode means including at least gate and source electrodes and coupled by said electrode means to receive said RF signal and said channel related signal to generate an IF signal, first means coupled to said electrode means to develop the bias therefore to establish the optimum DC operating point for said FET for one of said channels and, second means coupled to said electrode means and responsive to said tuning voltage to modify FET drain current to establish the optimum DC operating point for said FET for at least another of said channels within said band.

2. The invention recited in claim 1 wherein said first means controls the bias voltage and drain current of said FET to establish the optimum conversion gain for one of said channels.

3. The invention recited in claim 1 wherein said second means modifies said drain current to minimize intermodulation and cross modulation products for at least another of said channels.

4. The invention recited in claim 1 wherein said FET includes at least a gate electrode, a source electrode and a drain electrode, and said first means is coupled to said gate electrode and said source electrode to establish said bias voltage at an essentially constant value during modification of said drain current by said second means.

5. The invention recited in claim 1 wherein said first means is a resistor network connected to said gate electrode and to said source electrode and said second means is a transistor responsive to said tuning voltage and connected to said resistor biasing network to modify the effective resistance of that portion of said resistor biasing network connected to said source electrode to control the FET drain current in accordance with said tuning voltage.

6. In a tuner of the type for receiving an RF signal and having oscillator means including a tuning element responsive to a tuning voltage to generate a channel related signal for each of the channels within the band of frequencies being tuned, wherein the amplitude of said channel related signal varies in proportion to said tuning voltage, a FET mixer comprising:

a FET having at least gate and source electrode means and coupled by one of said electrode means to receive said RF signal and by one of said electrode means to receive said channel related signals to generate an IF signal, first means coupled to said electrode means to establish a DC operating point for said FET, and second means coupled to one of said electrode means and responsive to said tuning voltage to modify FET drain current to establish the optimum DC operating point for said FET for each channel in accordance with the level of said tuning voltage.

\* \* \* \* \*